United States Patent
Ariumi et al.

(10) Patent No.: US 11,700,697 B2
(45) Date of Patent: Jul. 11, 2023

(54) MULTILAYER SUBSTRATE AND ANTENNA ELEMENT

(71) Applicant: Murata Manufacturing Co., Ltd., Kyoto (JP)

(72) Inventors: Saneaki Ariumi, Kyoto (JP); Tomoshige Furuhi, Kyoto (JP); Sho Suzuki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 420 days.

(21) Appl. No.: 16/908,827

(22) Filed: Jun. 23, 2020

(65) Prior Publication Data
US 2020/0344896 A1 Oct. 29, 2020

Related U.S. Application Data

(63) Continuation of application No. PCT/JP2019/000321, filed on Jan. 9, 2019.

(30) Foreign Application Priority Data

Jan. 30, 2018 (JP) .................. 2018-013852

(51) Int. Cl.
*H01Q 1/38* (2006.01)
*H05K 3/46* (2006.01)
(Continued)

(52) U.S. Cl.
CPC ............ *H05K 3/46* (2013.01); *H01P 3/08* (2013.01); *H01Q 1/38* (2013.01); *H01Q 13/08* (2013.01); *H05K 1/09* (2013.01); *H05K 3/38* (2013.01)

(58) Field of Classification Search
CPC .. H05K 3/46; H05K 1/09; H05K 3/38; H05K 2201/10098; H05K 2203/0307;
(Continued)

(56) References Cited

U.S. PATENT DOCUMENTS

| 6,596,384 B1 * | 7/2003 | Day .................. H05K 3/382 428/209 |
| 2001/0010272 A1 | 8/2001 | Otsuka et al. |
| 2004/0007313 A1 * | 1/2004 | Day .................. H05K 3/382 430/313 |

FOREIGN PATENT DOCUMENTS

| JP | S61277207 A | 12/1986 |
| JP | 2001210959 A | 8/2001 |

(Continued)

OTHER PUBLICATIONS

English Translation WO2012081288A1, Murata (Year: 2012).*

(Continued)

*Primary Examiner* — Steven T Sawyer (74) *Attorney, Agent, or Firm* — Pearne & Gordon LLP (57) ABSTRACT

The insertion loss of a multilayer substrate and an antenna element is reduced. A multilayer substrate according to an embodiment of the present disclosure includes a multilayer body, a wire conductor, and a first ground electrode. The multilayer body is formed by dielectric layers being layered. The wire conductor is formed in the multilayer body, and a radio frequency signal passes through the wire conductor. The first ground electrode is formed in or on the multilayer body and includes a first surface that faces the wire conductor. The first surface includes a first region and a second region. The surface roughness of the first region is lower than the surface roughness of the second region. The first region overlaps at least part of the wire conductor in plan view in a direction normal to the first ground electrode.

16 Claims, 10 Drawing Sheets

(51) Int. Cl.
  *H01P 3/08*    (2006.01)
  *H01Q 13/08*   (2006.01)
  *H05K 1/09*    (2006.01)
  *H05K 3/38*    (2006.01)

(58) Field of Classification Search
  CPC .. H05K 1/0242; H05K 1/0245; H05K 1/0251; H01P 3/08; H01Q 1/38; H01Q 13/08; H01Q 1/48; H01Q 9/0407; H01Q 3/44
  See application file for complete search history.

(56) References Cited

FOREIGN PATENT DOCUMENTS

| JP | 2015105440 A | 6/2015 |
| JP | 2016092561 A | 5/2016 |

OTHER PUBLICATIONS

English Translation JP2015204497, Seiko Epson Corp (Year: 2015).*
International Search Report issued in Application No. PCT/JP2019/000321, dated Apr. 9, 2019.
Written Opinion issued in Application No. PCT/JP2019/000321, dated Apr. 9, 2019.

* cited by examiner

MULTILAYER SUBSTRATE AND ANTENNA ELEMENT

This is a continuation of International Application No. PCT/JP2019/000321 filed on Jan. 9, 2019 which claims priority from Japanese Patent Application No. 2018-013852 filed on Jan. 30, 2018. The contents of these applications are incorporated herein by reference in their entireties.

BACKGROUND

Technical Field

The present disclosure relates to a multilayer substrate and an antenna element.

There has been known that, because of the skin effect where electric currents flow near the surface of conductors at a high density, insertion loss of radio frequency signals decreases as the surface roughness of conductors decreases. For example, Japanese Unexamined Patent Application Publication No. 2015-105440 (Patent Document 1) discloses a configuration in which at least one surface of surface-treated copper foil where radio frequency signals pass through has a surface roughness RzJIS of 2.2 μm or less. The insertion loss of a multilayer substrate can be reduced by forming a feed wire of the multilayer substrate by using the surface-treated copper foil.

Patent Document 1: Japanese Unexamined Patent Application

BRIEF SUMMARY

For example, a ground electrode may be formed to face a conductor where radio frequency signals pass through as in strip lines, microstrip lines, microstrip antennas, or the like. In such a configuration, when radio frequency signals pass through the conductor, an electromagnetic field of the area surrounding the conductor fluctuates and a return path where radio frequency signals pass through is formed in the ground electrode. In other words, return signals, which are radio frequency signals that travel in the direction opposite to the direction in which radio frequency signals passing through the conductor, flow in the ground electrode. As a result of conducting intensive studies, the inventors of the present application have attained the knowledge that the insertion loss in a multilayer substrate is influenced by the surface roughness of a region, where such a return path is formed, of the ground electrode and found the problem that there is a limit to reducing such insertion loss, even if the surface roughness of the conductor is reduced as described in Patent Document 1.

The present disclosure reduces the insertion loss of multilayer substrates and antenna elements.

A multilayer substrate according to an embodiment of the present disclosure includes a multilayer body, a wire conductor, and a first ground electrode. The multilayer body is formed by a plurality of dielectric layers being layered. The wire conductor is formed in the multilayer body and radio frequency signals pass through the wire conductor. The first ground electrode is formed in or on the multilayer body and includes a first surface that faces the wire conductor. The first surface includes a first region and a second region. The first region has a surface roughness lower than a surface roughness of the second region. The first region overlaps at least part of the wire conductor in plan view in a direction normal to the first ground electrode.

An antenna element according to another embodiment of the present disclosure includes a multilayer substrate and a radiation electrode. The radiation electrode is formed on the multilayer substrate and radiates a radio frequency signal. The multilayer substrate includes a multilayer body and a first ground electrode. The multilayer body is formed by a plurality of dielectric layers being layered. The first ground electrode is formed in or on the multilayer body and includes a first surface that faces the radiation electrode. The first surface includes a first region and a second region. The first region has a surface roughness lower than a surface roughness of the second region. The first region overlaps at least part of the radiation electrode in plan view in a direction normal to the first ground electrode.

The multilayer substrate according to an embodiment of the present disclosure can reduce insertion loss, because a region having a low surface roughness of a surface, which faces the feed wire, of the ground electrode overlaps at least part of the feed wire.

The antenna element according to another embodiment of the present disclosure can reduce insertion loss, because a region having a low surface roughness of a surface, which faces the radiation electrode, of the ground electrode overlaps at least part of the radiation electrode.

DETAILED DESCRIPTION

The embodiments of the present disclosure are described in detail below with reference to the drawings. Note that the same or corresponding parts in the drawings are provided with the same numeral, and explanations thereof are not repeated.

In the embodiments, a maximum height roughness Rz, as defined in JIS-B-0601, is used as the surface roughness. The surface roughness is not limited to the maximum height roughness Rz and, for example, an arithmetic average roughness Ra or ten-point average roughness RzJIS as defined in JIS-B-0601 may be used. In addition, the surface roughness of the conductor can be changed by varying a conductive material (or a formation method) that forms the conductor.

Embodiment 1

Figure 1:
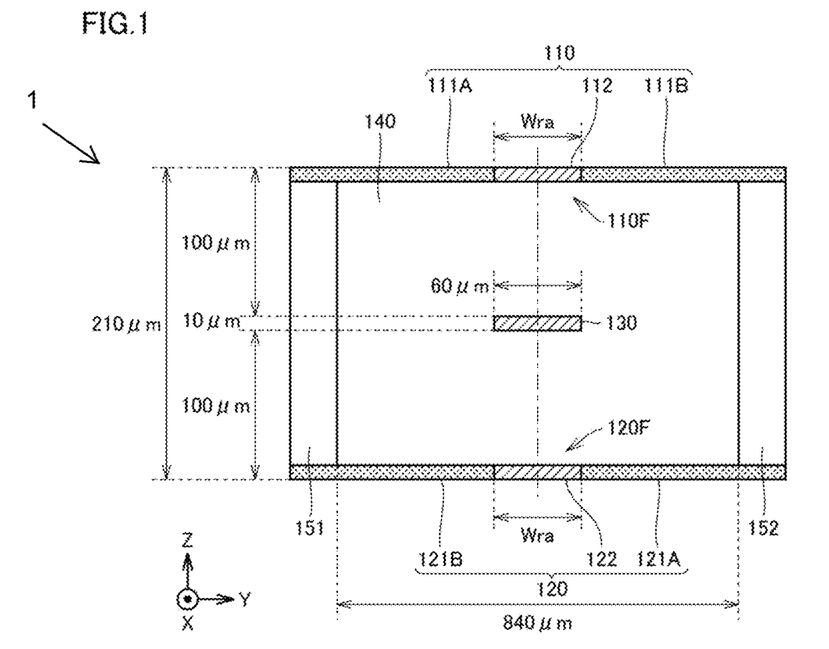
FIG. 1 is a plan view in the X-axis direction of a multilayer substrate according to Embodiment 1.

FIG. 1 is a plan view in the X-axis direction of a multilayer substrate 1 according to Embodiment 1. As illustrated in FIG. 1, the multilayer substrate 1 includes a ground electrode 110, which is a first ground electrode, a ground electrode 120, which is a second ground electrode, a feed wire 130, which is a wire conductor, a multilayer body 140, and connection conductors 151 and 152.

The multilayer body 140 is formed by layering dielectric layers in the Z-axis direction. The ground electrodes 110 and 120 are planar electrodes that are respectively formed on the upper surface and the bottom surface of the multilayer body 140, the normal to which is the Z-axis direction. Each of the connection conductors 151 and 152 connects the ground electrodes 110 and 120 to each other.

Each of the ground electrodes 110 and 120 may be formed within the multilayer body 140. The upper surface of the multilayer body 140 is on the positive side in the Z-axis direction, and the bottom surface of the multilayer body 140 is on the negative side in the Z-axis direction, and the upper surface and the bottom surface are not restrictive to those of the multilayer body 140 when the multilayer substrate 1 is actually used.

The feed wire 130 is formed in the multilayer body 140 and is a wire conductor through which radio frequency signals pass. Specifically, the feed wire 130 extends in the X-axis direction and is formed in a strip shape. The feed wire 130 is formed inside the multilayer body 140. The feed wire 130 is formed between the ground electrodes 110 and 120 and forms a strip line with the ground electrodes 110 and 120.

The ground electrode 110 includes a surface 110F, which is a first surface that faces the feed wire 130. The surface 110F includes regions 111A and 111B, which are second regions that each has a comparatively high surface roughness, and a region 112, which is a first region that has a comparatively low surface roughness. The region 112 is a strip-like region that extends in the X-axis direction and is formed along the center line of the feed wire 130 in plan view in the Z-axis direction. The region 112 has a surface roughness lower than a surface roughness of the regions 111A and 111B.

The ground electrode 120 includes a surface 120F, which is a second surface that faces the feed wire 130. The surface 120F includes regions 121A and 121B, which are fourth regions that have a comparatively high surface roughness, and a region 122, which is a third region that has a comparatively low surface roughness. The region 122, similar to the region 112, is a strip-like region that is formed along the center line of the feed wire 130. The region 122 has a surface roughness lower than a surface roughness of the regions 121A and 121B.

The surface roughness of the feed wire 130 is lower than that of the regions 111A and 111B and is lower than that of the regions 121A and 121B.

The region 112 overlaps at least part of the feed wire 130 in plan view in the Z-axis direction. Similarly, the region 122 overlaps at least part of the feed wire 130 in plan view in the Z-axis direction.

Figure 2:
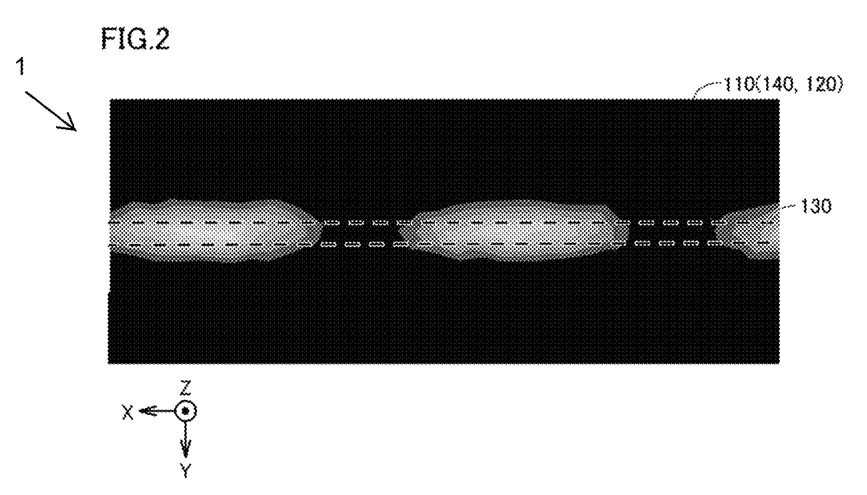
FIG. 2 is a plan view in the Z-axis direction illustrating the results of a simulation of the distribution of the surface current density at a ground electrode when radio frequency signals are passed through a feed wire.

FIG. 2 is a plan view in the Z-axis direction that illustrates the results of a simulation of the distribution of the surface current density in the ground electrode 110 when radio frequency signals pass through the feed wire 130. Surface current represents a current that flows on the surface of an electrode upon being influenced by the electromagnetic field of a radio frequency signal. Note that "electromagnetic field" is a general term for an electric field and a magnetic field. FIG. 2 illustrates that the surface current density (A/m) increases as the luminance increases.

As illustrated in FIG. 2, the portions with a high surface current density are concentrated around the feed wire 130 and its surrounding area. Thus, a return path for the radio frequency current that flows in the feed wire 130 is formed in the area, which faces the feed wire 130, in the ground electrode 110. In other words, a return signal flows in the ground electrode 110, which is a radio frequency signal that travels in the direction opposite to the direction in which radio frequency signals pass through the feed wire 130. As a result of conducting intensive studies, the inventors of the present application have attained the knowledge that the insertion loss of the multilayer substrate 1 is influenced by the surface roughness of a region, where the return path is formed, of the ground electrode 110 and found that there is a limit due to such influence to reducing the insertion loss.

Thus, in Embodiment 1, the surface 110F of the ground electrode 110 that faces the feed wire 130 is formed so that the region 112, which has a low surface roughness, overlaps at least part of the feed wire 130. As a result, the insertion loss of the multilayer substrate 1 can be reduced since the surface roughness in the portion in which the return path is formed can be reduced. In addition, the adhesion between the ground electrode 110 and the multilayer body 140 can be maintained since the region in which the surface roughness is reduced is limited to the region 112, which is part of the ground electrode 110. The same as that described for the ground electrode 110 applies to: the influence on the insertion loss of the multilayer substrate 1 due to the surface roughness of the region in which a return path is formed in the ground electrode 120, and the adhesion between the ground electrode 120 and the multilayer body 140.

Figure 3:
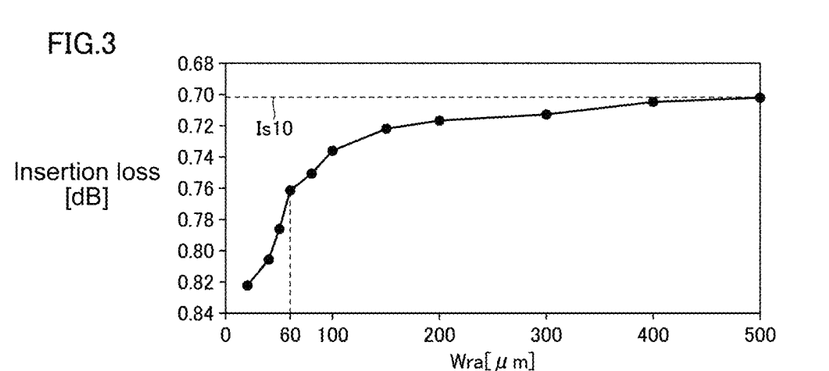
FIG. 3 illustrates the results of a simulation that shows the relationship between the width of the regions in FIG. 1 and insertion loss.

FIG. 3 illustrates the results of a simulation that shows the relationship between a width Wra of the regions 112 and 122 in FIG. 1 and insertion loss. FIG. 3 illustrates the relationship between the width Wra and insertion loss in the case where a certain surface roughness is set for the regions 111A, 111B, 121A, and 121B, and the surfaces of the regions 112 and 122 do not have any recesses or protrusions (i.e., the surface roughness is zero). An insertion loss Is10 is set as a theoretical value when each of the surfaces of the ground electrodes 110 and 120 do not have any recesses or protrusions (i.e., the surface roughness is zero).

Figure 4:
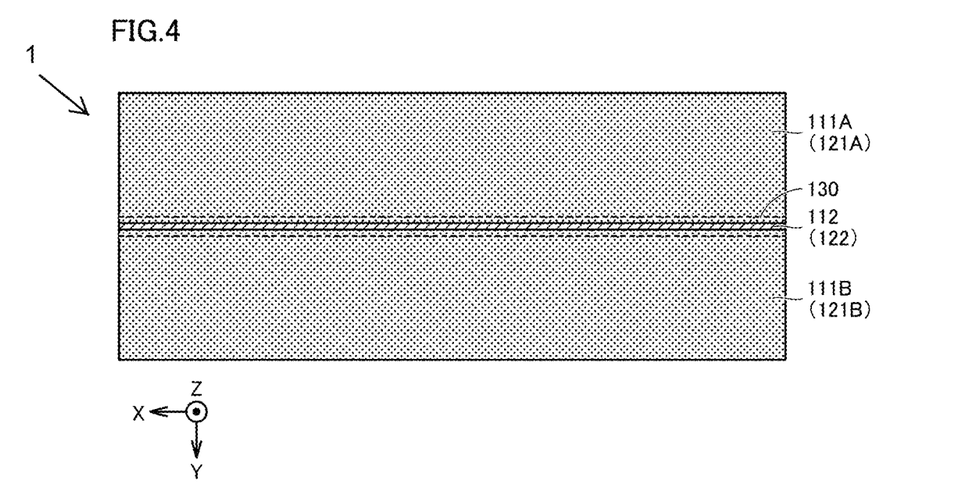
FIG. 4 is a plan view in the Z-axis direction of a multilayer substrate with the regions having a width of less than 60 μm.
Figure 5:
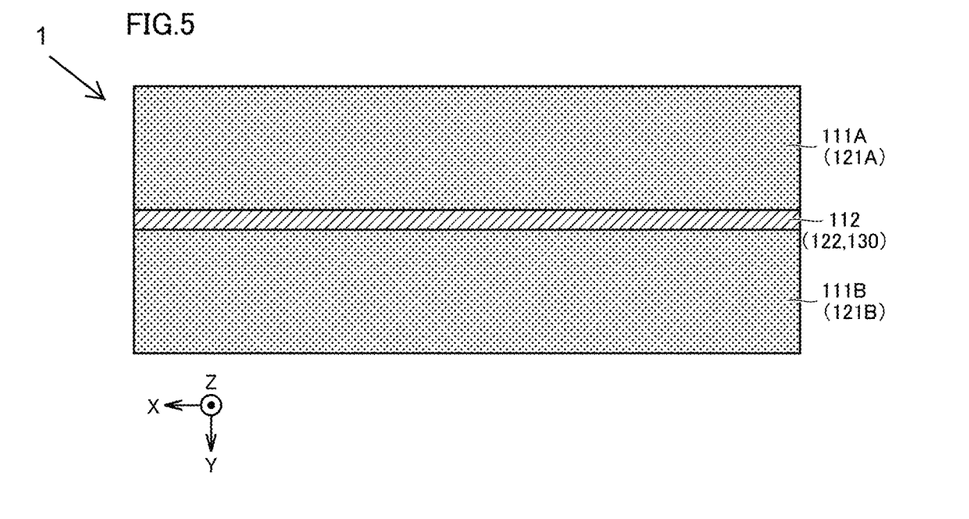
FIG. 5 is a plan view in the Z-axis direction of a multilayer substrate with the regions having a width of 60 μm.
Figure 6:
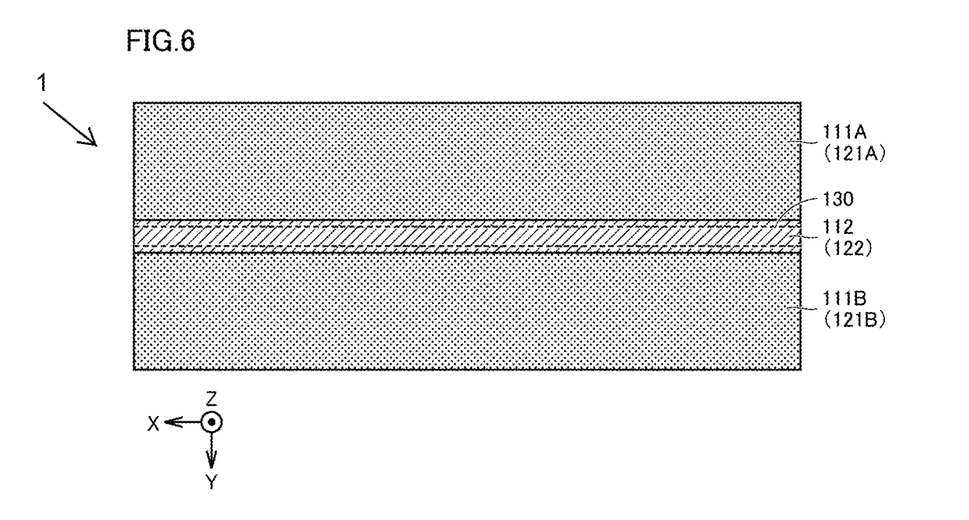
FIG. 6 is a plan view in the Z-axis direction of a multilayer substrate with the regions having a width of more than 60 μm.

FIG. 4 is a plan view in the Z-axis direction of the multilayer substrate 1 with regions 112 and 122 having a width Wra of less than 60 µm. FIG. 5 is a plan view in the Z-axis direction of the multilayer substrate 1 with regions 112 and 122 having a width Wra of 60 µm. FIG. 6 is a plan view in the Z-axis direction of the multilayer substrate 1 with regions 112 and 122 having a width Wra of more than 60 µm.

Referring to FIGS. 3 to 6, insertion loss decreases as the width Wra increases and becomes substantially equal to the theoretical value Is10 upon reaching 500 µm. The slope of the varying amount of the insertion loss when the width Wra is less than 60 µm is larger than the slope of the varying amount of the insertion loss when the width Wra is 60 µm or more. The insertion loss decreases significantly until the width Wra becomes equal to the width of the feed wire 130. The width Wra can be 60 µm or more where the regions 112 and 122 overlap the entire feed wire 130.

In addition, the insertion loss becomes approximately constant at the theoretical value Is10 when the width Wra of the regions 112 and 122, which have a low surface roughness, becomes larger than approximately eight times (480 µm) the width of the feed wire 130. On the other hand, in each of the surfaces of the ground electrodes 110 and 120 that faces the feed wire 130, adhesion between the ground electrodes 110 and 120 and the multilayer body 140 decreases if the regions 112 and 122 with low surface roughness become larger.

If the width Wra becomes larger than approximately eight times (480 µm) the width of the feed wire 130, the insertion loss does not decrease any further; however, the adhesion between the ground electrodes 110 and 120 and the multilayer body 140 decreases. It is desirable that the width Wra for the regions 112 and 122 with a low surface roughness be eight times or less the width of the feed wire 130 or less to maintain the adhesion between the ground electrodes 110 and 120 and the multilayer body 140.

Modification 1 of Embodiment 1

In Embodiment 1, a strip line where a feed wire is arranged between two ground electrodes is described. However, one of the two ground electrodes may be formed alone and the feed wire of the multilayer substrate according to the embodiment may be configured as a microstrip line along with the one of the ground electrodes.

Figure 7:
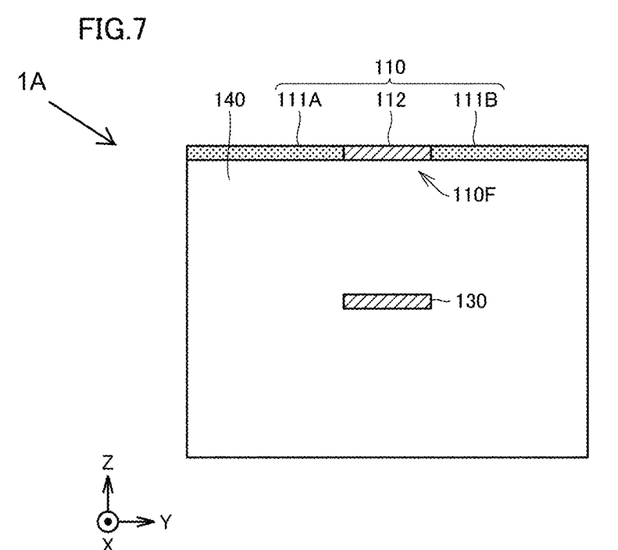
FIG. 7 is a plan view in the X-axis direction of a multilayer substrate according to Modification 1 of Embodiment 1.

FIG. 7 is a plan view in the X-axis direction of a multilayer substrate 1A according to Modification 1 of Embodiment 1. The configuration of the multilayer substrate 1A is a configuration without necessarily the ground electrode 120 and the connection conductors 151 and 152. Other than the foregoing, the rest of the configuration is the same; thus, an explanation thereof is not repeated. As illustrated in FIG. 7, the feed wire 130 forms a microstrip line with the ground electrode 110.

Modification 2 of Embodiment 1

In Embodiment 1 and Modification 1 thereof, an example in which the surface roughness of the feed wire is lower than the surface roughness of the second regions (the regions 111A and 111B) of the ground electrode is described. In the multilayer substrate according to the embodiment, the surface roughness of the first region (the region 112), which overlaps at least part of the feed wire, simply needs to be lower than the surface roughness of the second region. The surface roughness of the feed wire may be the same or higher than the surface roughness of the second region.

Figure 8:
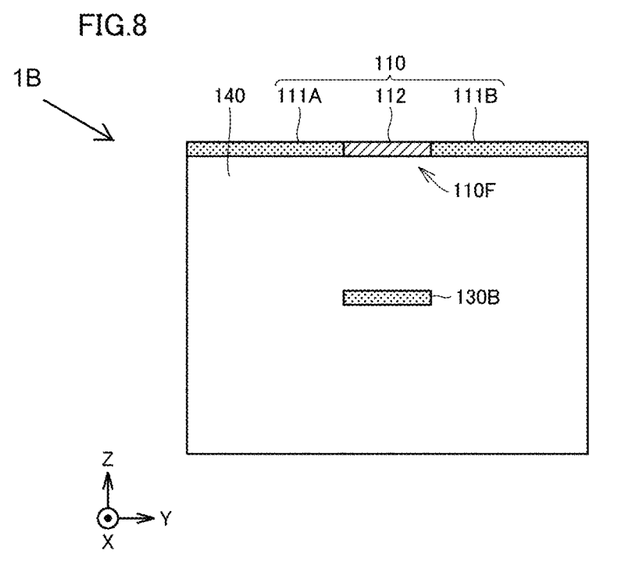
FIG. 8 is a plan view in the X-axis direction of a multilayer substrate according to Modification 2 of Embodiment 1.

FIG. 8 is a plan view in the X-axis direction of a multilayer substrate 1B according to Modification 2 of Embodiment 1. The multilayer substrate 1B has a configuration in which a feed wire 130B replaces the feed wire 130 of the multilayer substrate 1A in FIG. 7. The surface roughness of the feed wire 130B is the same as or higher than the surface roughness of the regions 111A and 111B. All other configurations are the same and explanations thereof are not repeated.

Modification 3 of Embodiment 1

In Embodiment 1 and Modifications 1 and 2 thereof, examples having one first region, with a low surface roughness, in a surface of a ground electrode that faces the feed wire are described. There may be two or more first regions within the surface.

Figure 9:
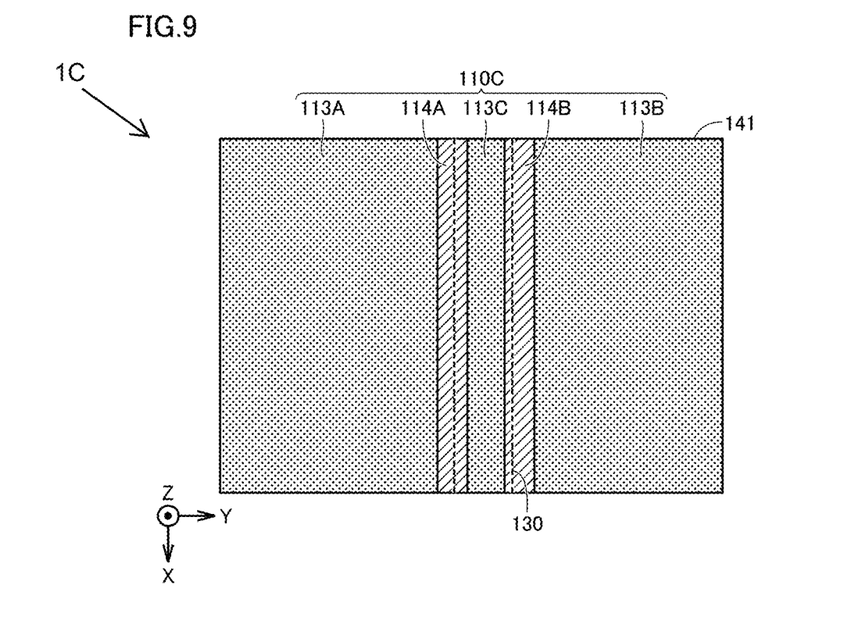
FIG. 9 is a plan view in the Z-axis direction of a multilayer substrate according to Modification 3 of Embodiment 1.

FIG. 9 is a plan view in the Z-axis direction of a multilayer substrate 1C according to Modification 3 of Embodiment 1. As illustrated in FIG. 9, the multilayer substrate 1C includes a ground electrode 110C, which is the first ground electrode, the feed wire 130, and a multilayer body 141.

The ground electrode 110C is a planar electrode that is formed on the upper surface of the multilayer body 141, the normal to which is the Z-axis direction. The surface of the ground electrode 110C that faces the feed wire 130 includes regions 113A to 113C, which are second regions, and regions 114A and 114B, which are first regions. Each of the regions 114A and 114B is a strip-like region that extends in the X-axis direction. Each of the regions 114A and 114B has a surface roughness lower than a surface roughness of each of the regions 113A to 113C. Each of the regions 114A and 114B overlaps part of the feed wire 130 in plan view in the Z-axis direction.

Modification 4 of Embodiment 1

In Embodiment 1 and Modifications 1 to 3 thereof, examples in which the first region of the first ground electrode extends in the same direction as the feed wire are described. The first region may be formed to extend in a direction different from the direction in which the feed wire extends.

Figure 10:
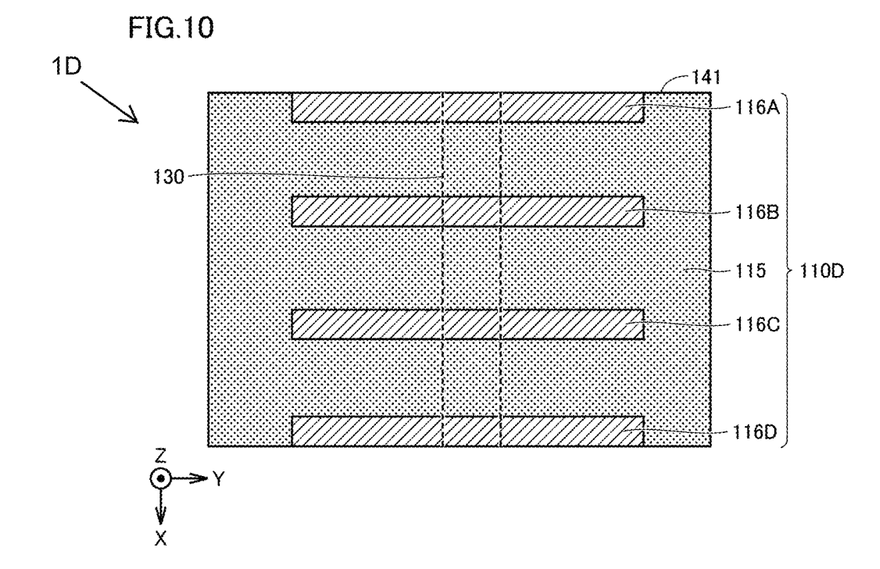
FIG. 10 is a plan view in the Z-axis direction of a multilayer substrate according to Modification 4 of Embodiment 1.

FIG. 10 is a plan view in the Z-axis direction of a multilayer substrate 1D according to Modification 4 of Embodiment 1. A multilayer substrate 1D has a configuration in which a ground electrode 110D, which is the first ground electrode, replaces the ground electrode 110C of the multilayer substrate 1C in FIG. 9. All other configurations are the same and explanations thereof are not repeated.

As illustrated in FIG. 10, the ground electrode 110D includes a region 115, which is a second region, and regions 116A to 116D, which are first regions. Each of the regions 116A to 116D is a strip-like region that extends in the Y-axis direction. The direction in which each of the regions 116A to 116D extends differs from the direction in which the feed wire 130 extends. The surface roughness of each of the regions 116A to 116D is smaller than the surface roughness of the region 115. Each of the regions 116A to 116D overlaps part of the feed wire 130 in plan view in the Z-axis direction.

As stated above, insertion loss can be reduced by using the multilayer substrates according to Embodiment 1 and Modifications 1 to 4.

Embodiment 2

In Embodiment 1, an example in which the first region with a low surface roughness, in the surface of the ground electrode that faces the feed wire, has a strip-like form that is similar to the feed wire is described. Embodiment 2 describes an example in which the first region is in a mesh-like form. If the first region is a mesh-like region, part of the first region that overlaps the feed wire can be ensured to a certain extent regardless of the form of the feed wire. Insertion loss can be reduced regardless of the form of the feed wire by using the multilayer substrate according to Embodiment 2.

Figure 11:
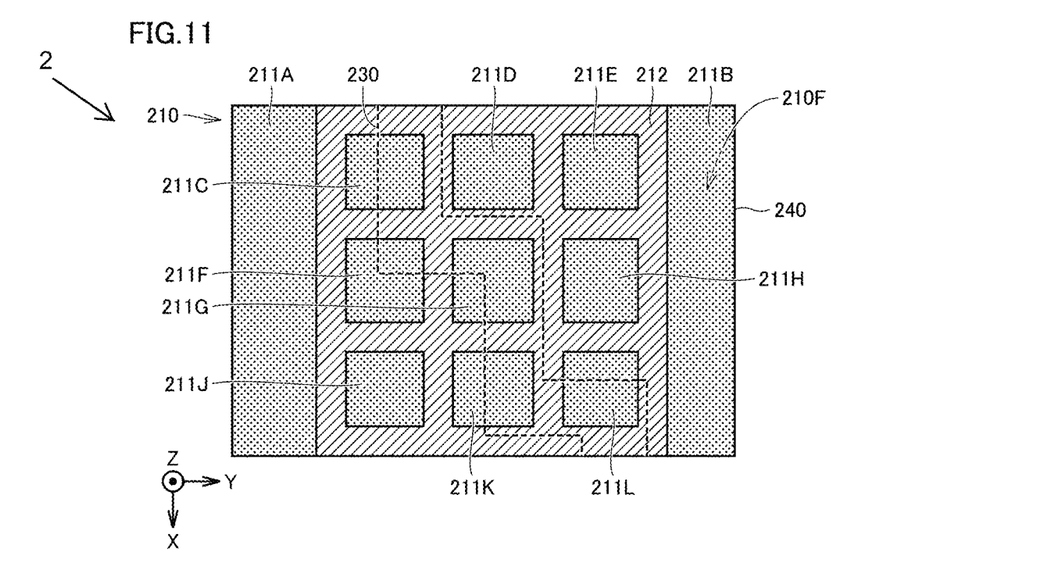
FIG. 11 is a plan view in the Z-axis direction of a multilayer substrate according to Embodiment 2.

FIG. 11 is a plan view in the Z-axis direction of a multilayer substrate 2 according to Embodiment 2. As illustrated in FIG. 11, the multilayer substrate 2 includes a ground electrode 210, which is the first ground electrode, a feed wire 230, which is the wire conductor, and a multilayer body 240.

The feed wire 230 is a strip-like conductor through which radio frequency signals pass. The feed wire 230 includes a portion that extends in the X-axis direction and a portion that extends in the Y-axis direction. The feed wire 230 bends at the junction point of the two portions.

The ground electrode 210 is a planar electrode that is formed on the upper surface of the multilayer body 240, the normal to which is the Z-axis direction. The ground electrode 210 includes a surface 210F, which is a first surface that faces the feed wire 230. The surface 210F includes regions 211A to 211H and 211J to 211L, which are second regions, and a region 212, which is a first region.

The region 212 is formed in a mesh-like form by first strip-like regions that extend in the Y-axis direction and second strip-like regions that extend in the X-axis direction intersecting with each other. Each of the regions 211C to 211H and 211J to 211L is surrounded by the region 212. The surface roughness of the region 212 is smaller than the surface roughness of each of the regions 211A to 211H and 211J to 211L. The region 212 overlaps part of the feed wire 230 in plan view in the Z-axis direction.

As stated above, insertion loss can be reduced by using the multilayer substrate according to Embodiment 2.

Embodiments 3 and 4 describe an antenna element according to an embodiment. Embodiment 3 describes an example in which a surface of a ground electrode, which faces a radiation electrode of an antenna element, has a region with low surface roughness that overlaps the radiation electrode. Embodiment 4 describes an example in which a surface of a ground electrode, which faces a radiation electrode, has a region with low surface roughness that overlaps the radiation electrode, and a surface of a ground electrode, which faces a feed wire, has a region with low surface roughness that overlaps the feed wire.

Embodiment 3

Figure 12:
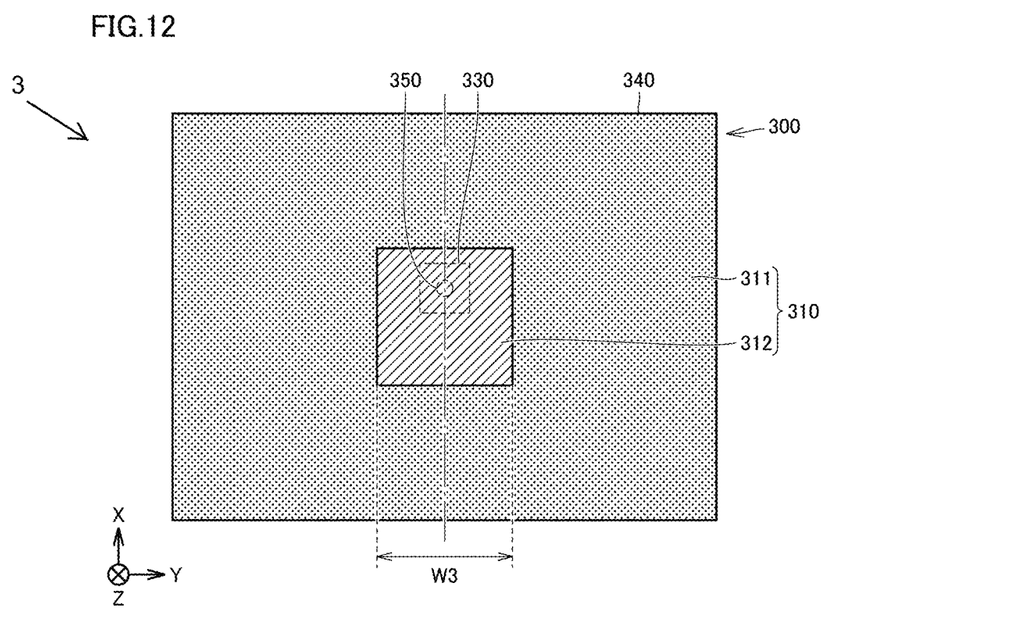
FIG. 12 is a plan view in the Z-axis direction of an antenna element according to Embodiment 3.
Figure 13:
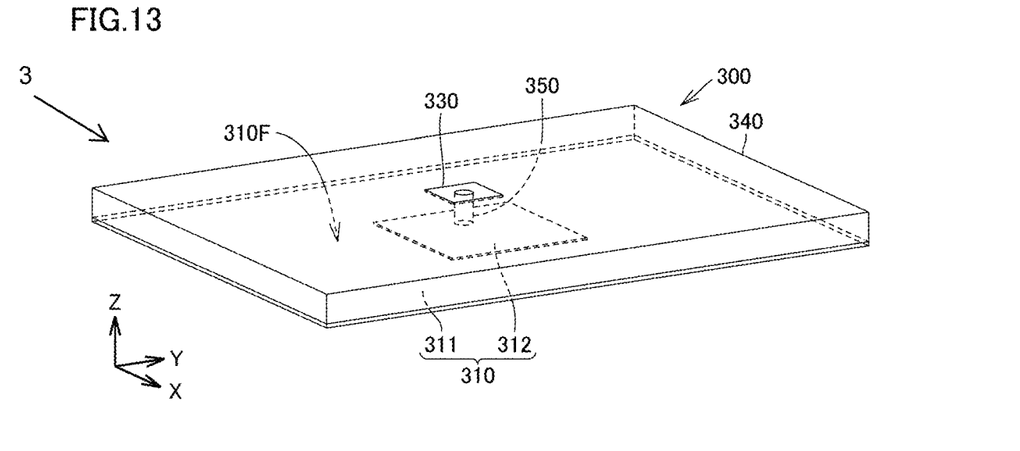
FIG. 13 is an external perspective view of the antenna element in FIG. 12.

FIG. 12 is a plan view in the Z-axis direction of an antenna element 3 according to Embodiment 3. FIG. 13 is an external perspective view of the antenna element 3 in FIG. 12. As illustrated in FIGS. 12 and 13, the antenna element 3 includes a multilayer substrate 300 and a radiation electrode 330. The antenna element 3 is a microstrip antenna.

The multilayer substrate 300 includes a ground electrode 310, which is a first ground electrode, a multilayer body 340, and a via conductor 350. The multilayer body 340 is formed by dielectric layers being layered in the Z-axis direction. The radiation electrode 330 is formed on the upper surface of the multilayer body 340, the normal to which is the Z-axis direction. The ground electrode 310 is formed on the bottom surface of the multilayer body 340, the normal to which is the Z-axis direction.

The radiation electrode 330 is connected to a radio frequency integrated circuit (RFIC) (not shown) by the via conductor 350 that extends in the Z-axis direction. The via conductor 350 is insulated from the ground electrode 310 and extends through the ground electrode 310. Radio frequency signals from the RFIC are radiated outwards from the radiation electrode 330. Radio frequency signals from outside are received by the radiation electrode 330 and are transmitted to the RFIC.

The ground electrode 310 includes a surface 310F, which is a first surface that faces the radiation electrode 330. The surface 310F includes a region 311, which is a second region with a comparatively high surface roughness, and a region 312, which is a first region with a comparatively low surface roughness. The region 312 has a surface roughness lower than a surface roughness of the region 311. When viewing FIGS. 12 and 13 in plan view in the Z-axis direction, the region 312 overlaps the entire radiation electrode 330. The region 312 simply needs to overlap at least part of the radiation electrode in plan view in the Z-axis direction.

Figure 14:
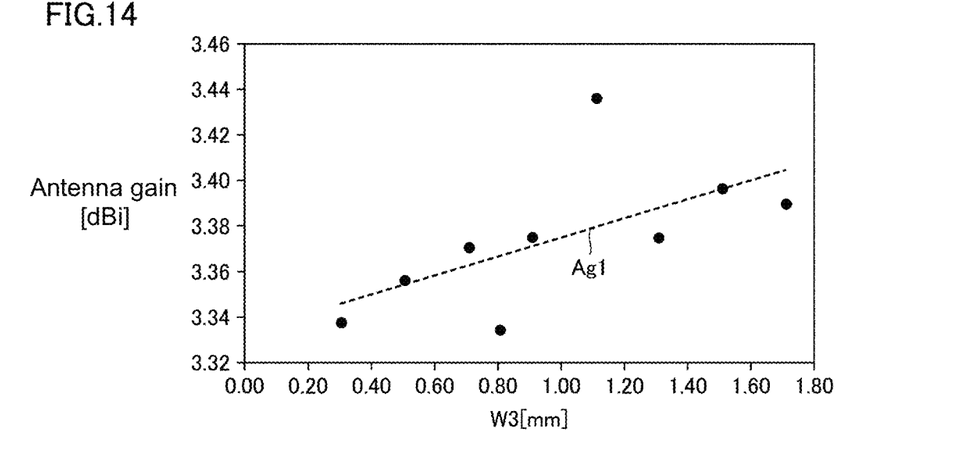
FIG. 14 illustrates the results of a simulation that shows the antenna gain (dBi) when the radiation electrode is square-shaped and the length of a side of the radiation electrode is changed.

FIG. 14 illustrates the results of a simulation that shows the antenna gain (dBi) when the radiation electrode 330 is square-shaped and the length W3 of a side of the radiation electrode 330 is changed. FIG. 14 illustrates the results of a simulation in which the surface of the region 312 does not have any recesses or protrusions (the surface roughness is zero). The straight line Ag1 in FIG. 14 is a straight line that was obtained by using the least-squares method from the points plotted in the figure.

The straight line Ag1 shown in FIG. 14 indicates that the antenna gain increases as the length W3 of a side of the radiation electrode 330 becomes longer. Generally, the insertion loss of the antenna element is lower as the antenna gain of the antenna element is higher. The insertion loss of the antenna element 3 is reduced by forming the region 312 with a low surface roughness.

As stated above, insertion loss can be reduced by using the antenna element according to Embodiment 3.

Embodiment 4

Figure 15:
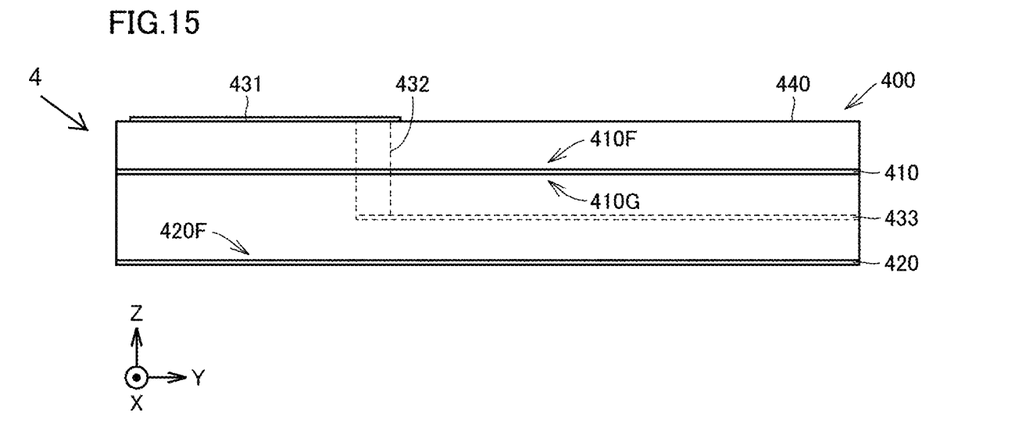
FIG. 15 is a plan view in the X-axis direction of an antenna element according to Embodiment 4.

FIG. 15 is a plan view in the X-axis direction of an antenna element 4 according to Embodiment 4. As is illustrated in FIG. 15, the antenna element 4 includes a multilayer substrate 400 and a radiation electrode 431. The antenna element 4 is a microstrip antenna.

The multilayer substrate 400 includes a ground electrode, which is a first ground electrode, a ground electrode 420, which is a second ground electrode; a via conductor 432, a feed wire 433, which is a wire conductor, and a multilayer body 440. The multilayer body 440 is formed by dielectric layers being layered in the Z-axis direction. The radiation electrode 431 is formed on the upper surface of the multilayer body 440, the normal to which is the Z-axis direction. The ground electrode 420 is formed on the bottom surface of the multilayer body 440, the normal to which is the Z-axis direction.

The ground electrode 410 is formed between the radiation electrode 431 and the ground electrode 420. The feed wire 433 is formed between the ground electrodes 410 and 420. The feed wire 433 is connected to the RFIC (not shown). The feed wire 433 and the ground electrodes 410 and 420 configure a strip line.

The radiation electrode 431 is connected to the feed wire 433 by the via conductor 432 that extends in the Z-axis direction. Radio frequency signals from the RFIC are radiated outwards from the radiation electrode 431. Radio frequency signals from outside are received by the radiation electrode 431 and transmitted to the RFIC. The frequency of radio frequency signals that pass through the feed wire 433 are, for example, 28 GHz, 39 GHz, or 60 GHz.

Figure 16:
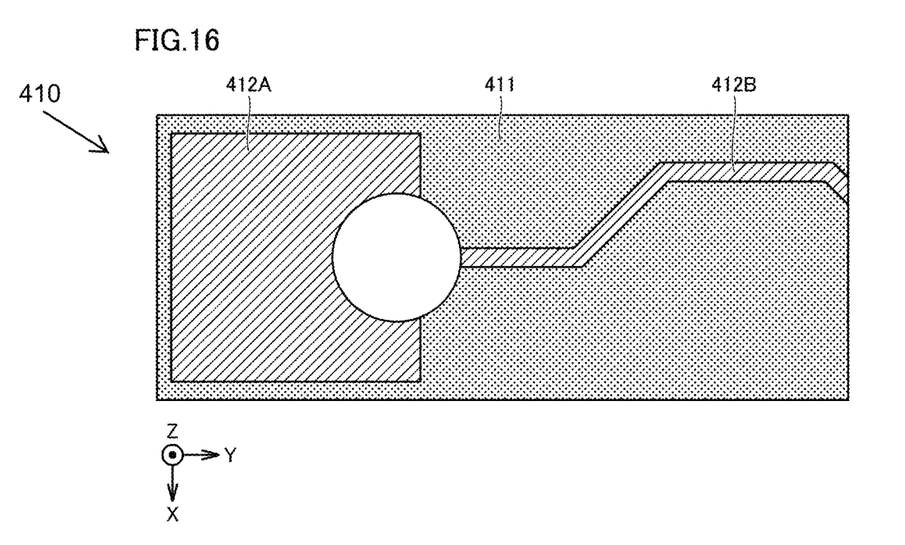
FIG. 16 is a plan view in the Z-axis direction of the ground electrode in FIG. 15.

FIG. 16 is a plan view in the Z-axis direction of the ground electrode 410 in FIG. 15. Referring to FIGS. 15 and 16, the ground electrode 410 includes a surface 410F, which is a first surface that faces the radiation electrode 431. The surface 410F includes a region 411, which is a second region that has a comparatively high surface roughness, and regions 412A and 412B, which are first regions that have a comparatively low surface roughness. The ground electrode 410 includes a surface 410G, which is a third surface that faces the feed wire 433. The surface 410G includes a region 411, which is a sixth region that has a comparatively high surface roughness, and regions 412A and 412B, which are fifth regions that have a comparatively low surface roughness. The surface roughness of the region 412A and the surface roughness of the region 412B are both lower than the surface roughness of region 411.

The regions 411, 412A and 412B on the surface 410F may be different from the regions 411, 412A and 412B on the surface 410G. For example, the first region and the fifth region do not have to overlap in plan view in the Z-axis direction. The same applies for the second region and the sixth region.

Figure 17:
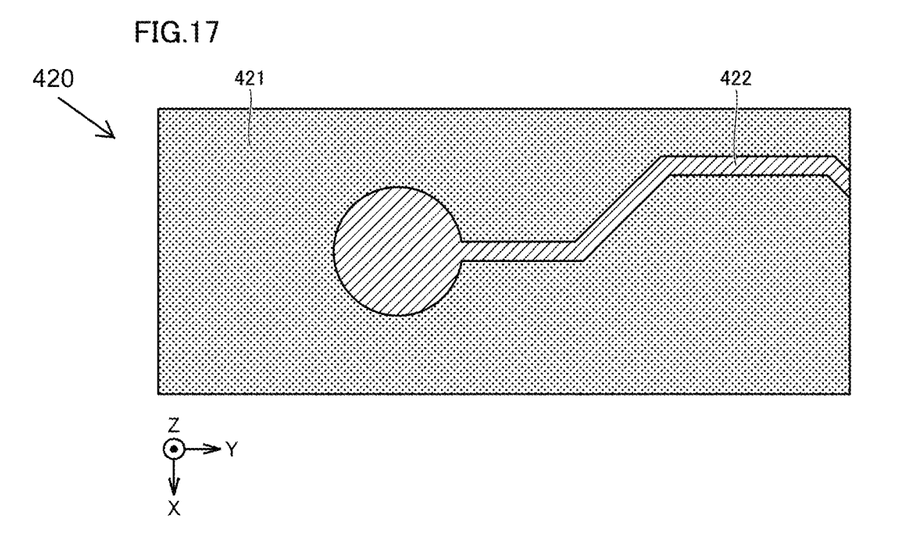
FIG. 17 is a plan view in the Z-axis direction of the ground electrode in FIG. 15.

FIG. 17 is a plan view in the Z-axis direction of the ground electrode 420 in FIG. 15. Referring to FIGS. 15 and 17, the ground electrode 420 includes a surface 420F, which is a third surface that faces the feed wire 433. The surface 420F includes a region 421, which is a sixth region that has a comparatively high surface roughness, and a region 422, which is a fifth region that has a comparatively low surface roughness. The region 422 has a surface roughness lower than a surface roughness of the region 421.

Figure 18:
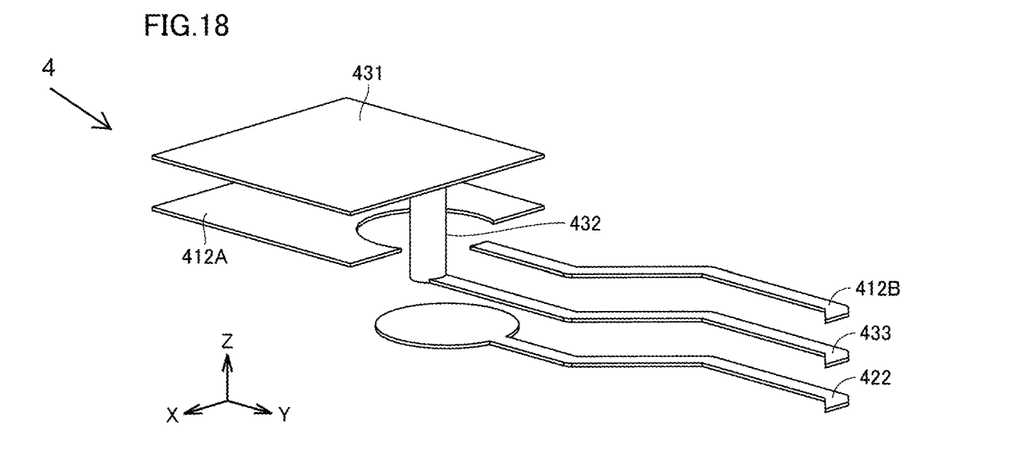
FIG. 18 is a perspective view of the antenna element in FIG. 15.

FIG. 18 is a perspective view of the antenna element 4 in FIG. 15. FIG. 18 omits illustration of the multilayer body 440, the region 411 of the ground electrodes 410, and the region 421 of the ground electrode 420 so that the positional relationships between the following elements are easily seen: the radiation electrode 431 of the antenna element 4, the regions 412A and 412B of the ground electrode 410, the feed wire 433, and the region 422 of the ground electrode 420.

Referring to FIGS. 16 to 18, the surface roughness of the feed wire 433 is lower than both the surface roughness of the region 411 of the ground electrode 410 and the surface roughness of the region 421 of the ground electrode 420.

The region 412A overlaps part of the radiation electrode 431 in plan view in the Z-axis direction. The region 412B overlaps part of the feed wire 433 in plan view in the Z-axis direction. The region 422 overlaps part of the radiation electrode 431 and the entire feed wire 433 in plan view in the Z-axis direction. The regions 412A and 422 as a whole overlap the entire radiation electrode 431 in plan view in the Z-axis direction.

The configuration of the antenna element according to Embodiment 4 is not restrictive to the configuration described above. For example, the antenna element may include one of the ground electrode 410 and the ground electrode 420. In other words, the feed wire 433 and the ground electrode 410 may configure a microstrip line, or the feed wire 433 and the ground electrode 420 may configure a microstrip line. The feed wire and the ground electrode may be formed on the same dielectric layer as in a notch antenna.

Modification of Embodiment 4

In Embodiment 4, an example in which the first ground electrode is formed between the radiation electrode and the feed wire is described. The first ground electrode may be formed on a layer that is lower than the feed wire. That is, the feed wire may be formed between the radiation electrode and the first ground electrode.

Figure 19:
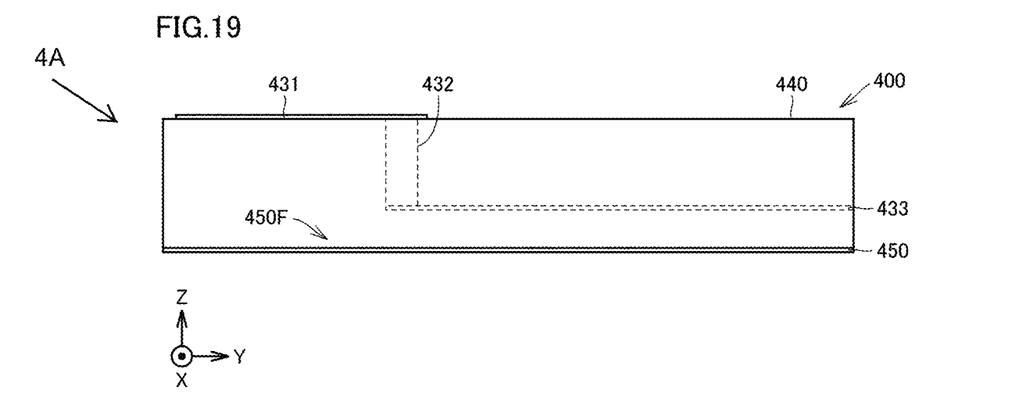
FIG. 19 is a plan view in the X-axis direction of the antenna element according to Modification of Embodiment 4.

FIG. 19 is a plan view in the X-axis direction of an antenna element 4A according to Modification of Embodiment 4. The configuration of the antenna element 4A does not include the ground electrode 410 in the configuration of the antenna element 4 in FIG. 15. Also, the configuration of the antenna element 4A replaces the ground electrode 420, which is the second ground electrode, with a ground electrode 450, which is a first ground electrode. Other than the foregoing, the rest of the configuration is the same; thus, an explanation thereof is not repeated.

Figure 20:
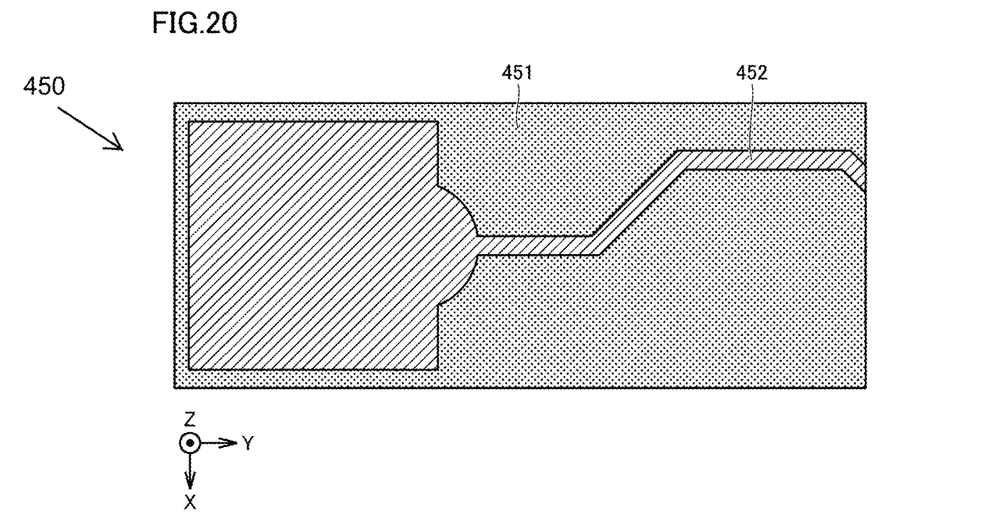
FIG. 20 is a plan view in the Z-axis direction of the ground electrode in FIG. 19.

FIG. 20 is a plan view in the Z-axis direction of the ground electrode 450 in FIG. 19. Referring to FIGS. 19 and 20, the ground electrode 450 includes a radiation electrode 431 and a surface 450F, which is a first surface that faces the feed wire 433. The surface 450F includes a region 451, which is a second region that has a comparatively high surface roughness, and a region 452, which is a first region that has a comparatively low surface roughness. The region 452 has a surface roughness lower than a surface roughness of the region 451.

Figure 21:
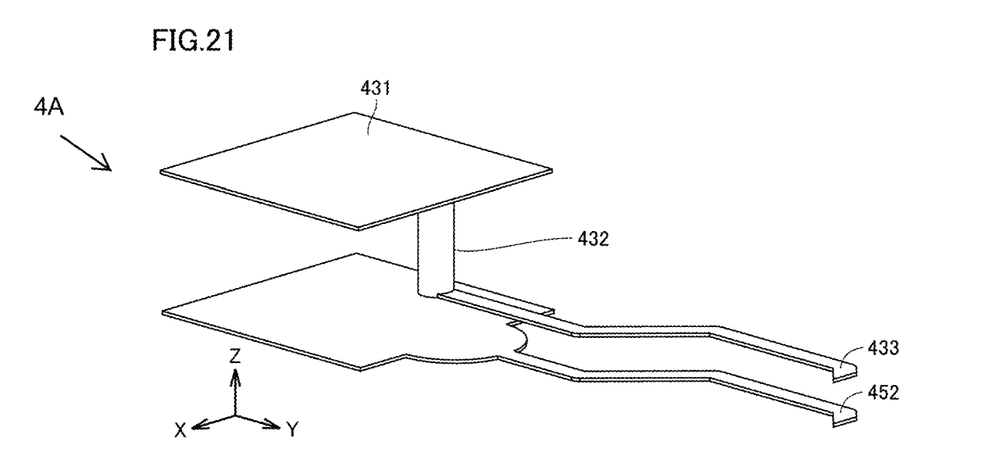
FIG. 21 is a perspective view of the antenna element in FIG. 19.

FIG. 21 is a perspective view of the antenna element 4A in FIG. 19. FIG. 21 omits illustration of the multilayer body 440 and the region 451 of the ground electrode 450 so that the positional relationships between the following elements are easily seen: the radiation electrode 431 of the antenna element 4A, the feed wire 433, and the region 452 of the ground electrode 450.

Referring to FIGS. 19 to 21, the feed wire 433 has a surface roughness lower than a surface roughness of the region 451 of the ground electrode 450. In plan view in the Z-axis direction, the region 452 overlaps the entire radiation electrode 431 and overlaps the entire feed wire 433.

As stated above, insertion loss is reduced by using the antenna element according to Embodiment 4 and Modification thereof.

Embodiments disclosed may be implemented by being appropriately combined with each other as long as inconsistencies do not arise. All of the features of the embodiments disclosed are illustrative and should not be considered to be restrictive. The scope of the present disclosure is illustrated by the scope of claims and not the explanation above. Any changes within the meaning and scope equivalent to the scope of claims are intended to be included.

REFERENCE SIGNS LIST 1, 1A, 1B, 1C, 1D, 2, 300, 400 Multilayer substrate, 3, 4, 4A Antenna element, 110, 110C, 110D, 120, 210, 310, 410, 420, 450 Ground electrode, 130, 130B, 131, 230, 433 Feed wire, 140, 141, 240, 340, 440 Multilayer body, 151, 152 Connection conductor, 330, 431 Radiation electrode, 350, 432 Via conductor

What is claimed is:

1. A multilayer substrate, comprising:
a multilayer body including a plurality of dielectric layers being layered;
a wire conductor in the multilayer body and through which a radio frequency signal passes;
a first ground electrode in or on the multilayer body and that includes a first surface facing a first main surface of the wire conductor; and
a second ground electrode that is in or on the multilayer body and that includes a second surface facing the first surface of the first ground electrode, wherein
the first surface includes a first region and a second region,
a surface roughness of the first region is lower than a surface roughness of the second region,
the first region overlaps at least part of the first main surface of the wire conductor in plan view in a direction normal to the first surface of the first ground electrode,
the wire conductor is between the first ground electrode and the second ground electrode,
the second surface includes a third region and a fourth region,
a surface roughness of the third region is lower than a surface roughness of the fourth region, and
the third region overlaps at least part of the first main surface of the wire conductor in plan view in the direction normal to the first surface of the first ground electrode.

2. The multilayer substrate according to claim 1, wherein the first region is surrounded by the second region.

3. The multilayer substrate according to claim 2, wherein the first region includes
a plurality of first strip-like regions that extend in a first direction and
a plurality of second strip-like regions that extend in a second direction that differs from the first direction, and
the first region comprises the plurality of first strip-like regions and the plurality of second strip-like regions intersecting the plurality of first strip-like regions.

4. The multilayer substrate according to claim 1, wherein the first region overlaps an entirety of the first main surface of the wire conductor in plan view in the direction normal to the first surface of the first ground electrode.

5. The multilayer substrate according to claim 4, wherein each of the first region and the wire conductor has a strip-like shape,
the wire conductor is along the first region in plan view in the direction normal to the first surface of the first ground electrode, and
a width of the first region is eight times or less a width of the wire conductor.

6. The multilayer substrate according to claim 1, wherein a surface roughness of the wire conductor that faces the first surface of the first ground electrode is lower than the surface roughness of the second region.

7. An antenna element, comprising:
a multilayer substrate comprising;
a multilayer body including a plurality of dielectric layers being layered;
a wire conductor in the multilayer body and through which a radio frequency signal passes;
a first ground electrode that is in or on the multilayer body and that includes a first surface facing a first main surface of the wire conductor;
a radiation electrode on the multilayer body and that has a main surface facing the first surface of the first ground electrode; and
a via conductor that extends in the direction normal to the first surface of the first ground electrode and that connects the wire conductor to the radiation electrode, wherein
the radiation electrode is electrically connected to the wire conductor,
the first surface includes a first region and a second region,
a surface roughness of the first region is lower than a surface roughness of the second region,
the first region overlaps at least part of the first main surface of the wire conductor in plan view in a direction normal to the first surface of the first ground electrode
the first ground electrode includes a third surface that faces the main surface of the radiation electrode,
the third surface includes a fifth region and a sixth region,
a surface roughness of the fifth region is lower than a surface roughness of the sixth region, and
the fifth region overlaps at least part of the main surface of the radiation electrode in plan view in the direction normal to the first surface of the first ground electrode.

8. An antenna element, comprising:
a multilayer substrate; and
a radiation electrode on the multilayer substrate and that radiates a radio frequency signal, wherein
the multilayer substrate includes
a multilayer body including a plurality of dielectric layers being layered and
a first ground electrode in or on the multilayer body and that includes a first surface facing a main surface of the radiation electrode,
a wire conductor in the multilayer body and through which the radio frequency signal passes, and
a via conductor that extends in the direction normal to the first surface of the first ground electrode and that connects the wire conductor to the radiation electrode,
the first surface includes a first region and a second region,
a surface roughness of the first region is lower than a surface roughness of the second region,
the first region overlaps at least part of the main surface of the radiation electrode in plan view in a direction normal to the first surface of the first ground electrode,
the first ground electrode is between the radiation electrode and the wire conductor,
the first ground electrode further includes a second surface that faces a main surface of the wire conductor,
the second surface includes a third region and a fourth region, a surface roughness of the third region is lower than a surface roughness of the fourth region, and the third region overlaps at least part of the main surface of the wire conductor in plan view in the direction normal to the first surface of the first ground electrode.

9. The antenna element according to claim 8, wherein the multilayer substrate further includes a second ground electrode that is provided in or on the multilayer body and that faces the first surface of the first ground electrode, the wire conductor is provided between the first ground electrode and the second ground electrode, the second ground electrode includes a third surface that faces the main surface of the wire conductor, the third surface includes a fifth region and a sixth region, a surface roughness of the fifth region is lower than a surface roughness of the sixth region, and the fifth region overlaps at least part of the main surface of the wire conductor and overlaps at least part of the main surface of the radiation electrode in plan view in the direction normal to the first surface of the first ground electrode.

10. The antenna element according to claim 9, wherein the first region and the fifth region as a whole overlap an entirety of the main surface of the radiation electrode in plan view in the direction normal to the first surface of the first ground electrode.

11. The antenna element according to claim 8, wherein the wire conductor is between the radiation electrode and the first ground electrode, and the first region further overlaps at least part of the main surface of the wire conductor in plan view in the direction normal to the first ground electrode.

12. The antenna element according to claim 8, wherein the first region overlaps an entirety of the main surface of the radiation electrode in plan view in the direction normal to the first surface of the first ground electrode.

13. The multilayer substrate according to claim 2, wherein the first region overlaps an entirety of the first main surface of the wire conductor in plan view in the direction normal to the first surface of the first ground electrode.

14. The multilayer substrate according to claim 3, wherein the first region overlaps an entirety of the first main surface of the wire conductor in plan view in the direction normal to the first surface of the first ground electrode.

15. The multilayer substrate according to claim 2, wherein a surface roughness of the wire conductor that faces the first surface of the first ground electrode is lower than the surface roughness of the second region.

16. The multilayer substrate according to claim 3, wherein a surface roughness of the wire conductor that faces the first surface of the first ground electrode is lower than the surface roughness of the second region.

* * * * *